(12) United States Patent
Chen et al.

(10) Patent No.: US 7,901,951 B2
(45) Date of Patent: Mar. 8, 2011

(54) THIN FILM TRANSISTOR ARRAY SUBSTRATE AND METHOD FOR FABRICATING SAME

(75) Inventors: Hung-Yu Chen, Miao-Li (TW); Tsau-Hua Hsieh, Miao-Li (TW); Jia-Pang Pang, Miao-Li (TW)

(73) Assignee: Chimel Innolux Corporation, Miao-Li (TW)

( * ) Notice: Subject to any disclaimer, the term of this patent is extended or adjusted under 35 U.S.C. 154(b) by 566 days.

(21) Appl. No.: 12/005,715

(22) Filed: Dec. 28, 2007

(65) Prior Publication Data

US 2008/0157088 A1 Jul. 3, 2008

(30) Foreign Application Priority Data

Dec. 29, 2006 (TW) .............................. 95149713 A (51) Int. Cl.
| | |
|---|---|
| *H01L 21/00* | (2006.01) |
| *H01L 29/04* | (2006.01) |
| *H01L 29/10* | (2006.01) |
| *H01L 31/00* | (2006.01) |
| *G02F 1/136* | (2006.01) |

(52) U.S. Cl. .................... 438/4; 438/12; 257/59; 349/43

(58) Field of Classification Search .................... 438/12, 438/4, 30, 622, 158; 257/48, 355, 259, 59; 349/54, 43, 55
See application file for complete search history.

(56) References Cited

U.S. PATENT DOCUMENTS

| | | | |
|---|---|---|---|
| 5,926,702 | A | 7/1999 | Kwon et al. |
| 6,485,997 | B2 | 11/2002 | Lee et al. |
| 6,664,568 | B2 | 12/2003 | Lai |
| 7,053,977 | B2 | 5/2006 | Chang |
| 2006/0033130 | A1 | 2/2006 | Hashimoto et al. |
| 2006/0146245 | A1 | 7/2006 | Ahn et al. |
| 2007/0222727 | A1* | 9/2007 | Baek et al. ....................... 345/87 |

FOREIGN PATENT DOCUMENTS

| | | |
|---|---|---|
| CN | 1104339 A | 6/1995 |
| CN | 1797157 A | 7/2006 |
| TW | 594344 B | 6/2004 |

* cited by examiner

*Primary Examiner* — Walter L Lindsay, Jr.
(74) *Attorney, Agent, or Firm* — Wei Te Chung (57) ABSTRACT

An exemplary TFT array substrate includes: an insulating substrate (201), a gate line (23) and a repair structure (272) arranged on the insulating substrate, a gate insulating layer (204) covering the gate line and the repair structure; a data line (27) arranged on the gate insulating layer corresponding to the repair structure, which is insulated from the gate line and intersects with the gate line. The repair structure has a gap (274). The gap of the repair structure is located at where the repair structure overlapping to the gate line.

20 Claims, 7 Drawing Sheets

THIN FILM TRANSISTOR ARRAY SUBSTRATE AND METHOD FOR FABRICATING SAME

FIELD OF THE INVENTION

The present invention relates to thin film transistor (TFT) array substrates used in liquid crystal displays (LCDs) and methods for fabricating these substrates, and more particularly to a TFT array substrate having at least one repair line for restoring a data line's broken gap, and a method for fabricating the TFT array substrate.

BACKGROUND

A typical liquid crystal display (LCD) is capable of displaying a clear and sharp image through millions of pixels that make up the complete image. Thus, the liquid crystal display has been applied to various electronic equipments in which messages or pictures need to be displayed, such as mobile phones and notebook computers. A liquid crystal panel is a major component of the LCD, and generally includes a TFT array substrate, a color filter substrate opposite to the TFT array substrate, and a liquid crystal layer sandwiched between the two substrates.

Figure 17:
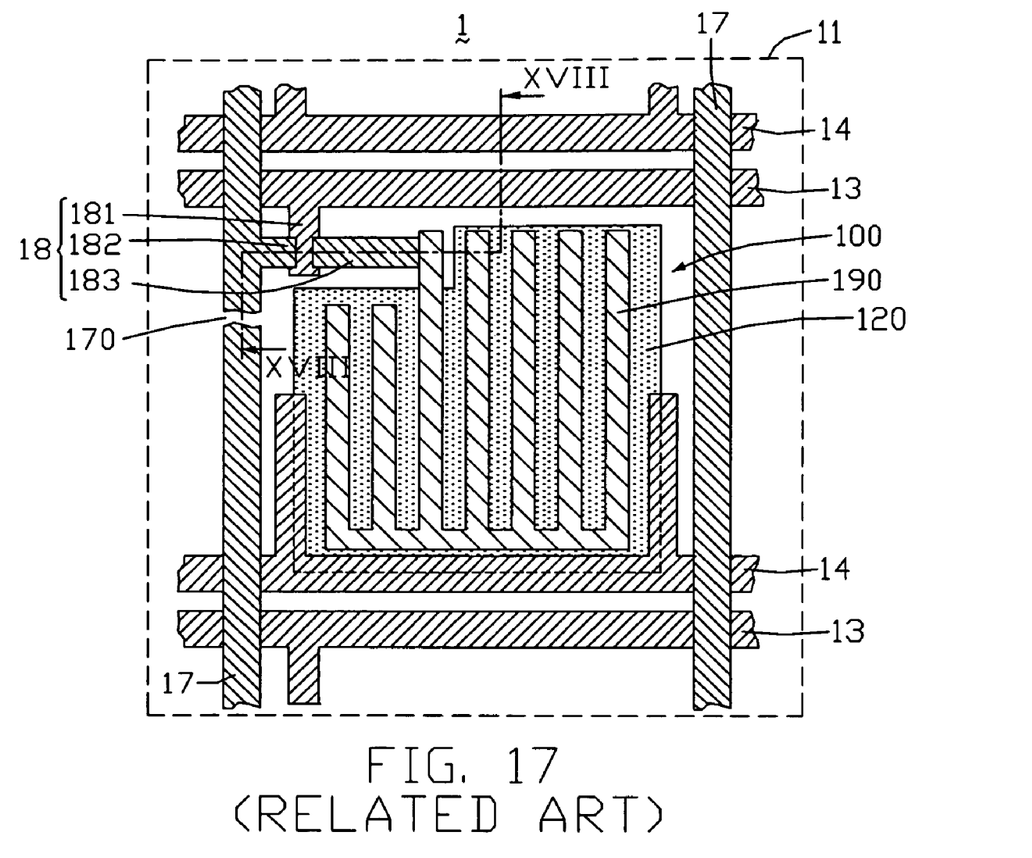
FIG. 17 is an abbreviated, top view of part of a conventional TFT array substrate.

Referring to FIG. 17, part of a typical TFT array substrate 1 is shown. The TFT array substrate 1 includes a plurality of gate lines 13, a plurality of common lines 14, and a plurality of data lines 17. The gate lines 13 are parallel to and spaced from each other. The data lines 17 are parallel to and spaced from each other, and are substantially perpendicular to the gate lines 13. Two adjacent gate lines 13 and two adjacent data lines 17 cooperatively define a pixel region 100. The common lines 14 are parallel to the gate lines 13, and each of the common lines 14 crosses a row of pixel regions 100.

In each pixel region 100, a TFT 18, a pixel electrode 190, and a common electrode 120 are provided. The TFT 18 is arranged in the vicinity of a respective point of intersection of the gate lines 13 and the data lines 17. The TFT 180 includes a gate electrode 181, a source electrode 182, and a drain electrode 183.

The pixel and common electrodes 190, 120 are laminated and insulated in the pixel region 100. The pixel and common electrodes 190, 120 are made of transparent conductive materials such as indium-tin-oxide (ITO) or indium-zinc-oxide (IZO). The common electrode 120 is electrically connected to the common line 14 in order to obtain common voltage signals.

Figure 18:
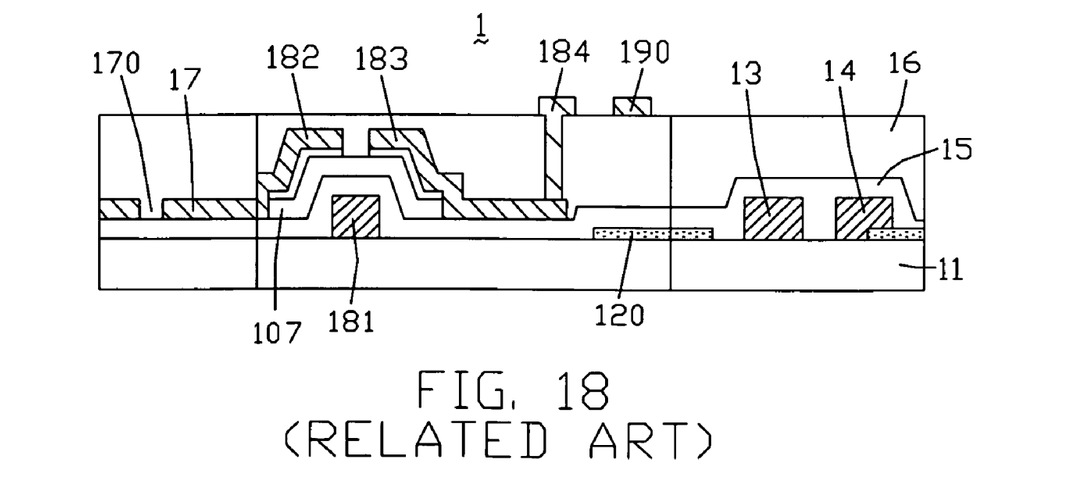
FIG. 18 is an enlarged, cross-sectional view taken along line XVIII-XVIII of FIG. 17.

Referring to FIG. 18, this is an enlarged, cross-sectional view taken along line XVIII-XVIII of FIG. 1. The TFT array substrate 10 further includes a substrate 11, a gate insulating layer 15, a semiconductor layer 107, and a passivation material layer 16. The gate line 13, the common line 14, the gate electrode 181, and the common electrode 120 are arranged on the substrate 11. The gate insulating layer 15 covers the common electrode 120, the gate line 13, the gate electrode 181, and the common line 14. The semiconductor layer 107 is formed on the gate insulating layer 15. The source electrode 182 and the drain electrode 183 are formed on the insulating layer 15 and the semiconductor layer 107 corresponding to the gate electrode 181. The passivation material layer 16 is formed on the gate insulating layer 15, the drain electrode 183 and the source electrode 182. The pixel electrode 190 is formed on the passivation material layer 16, and is electrically connected to the drain electrode 183 via the through hole 184 formed in the passivation material layer 16.

However, the data line 17 is prone to be damaged when the TFT array substrate 1 is being handled, transported, or cleaned. A broken gap 170 may occur when the corresponding data line 17 is damaged. Thus, the data line 17 is broken and unable to transfer data signals. This results in an impaired image in the pixel regions 100 corresponding to the broken data line 17.

What is needed, therefore, is a method for fabricating a TFT array substrate that can overcome the above-described deficiency. What is also needed is a TFT array substrate fabricated by the above method.

SUMMARY

In one preferred embodiment, a method for fabricating a thin film transistor (TFT) array substrate includes: providing an insulating substrate; forming a common electrode on the insulating substrate and a repair structure on the insulating substrate by a first photolithograph process, the repair structure having a plurality of gaps; forming a common line, a gate line, and a gate electrode on the insulating substrate by a second photolithograph process, the gate electrode being connected to the gate line; forming a gate insulating layer and a semiconductor layer on the gate insulating layer by a third photolithograph process, the semiconductor layer being above the gate electrode; and forming a data line and source/drain electrodes on the gate insulating layer by a fourth photolithograph process, the data line being above the repair structure and intersecting with the gate line and the common line, wherein the gaps of the repair structure each corresponds to an overlap with the gate line and the common line.

An exemplary TFT array substrate includes: an insulating substrate; a gate line and a repair structure arranged on the insulating substrate, the repair structure having a gap; a gate insulating layer covering the gate line and the insulating structure; a data line arranged on the gate insulating layer corresponding to the repair structure, which is insulated from the gate line and intersects with the gate line. The gap of the repair structure is located at where the repair structure overlapping to the gate line.

Other novel features and advantages will become more apparent from the following detailed description when taken in conjunction with the accompanying drawings. In the drawings, all the views are schematic.

DETAILED DESCRIPTION OF PREFERRED EMBODIMENTS

Figure 1:
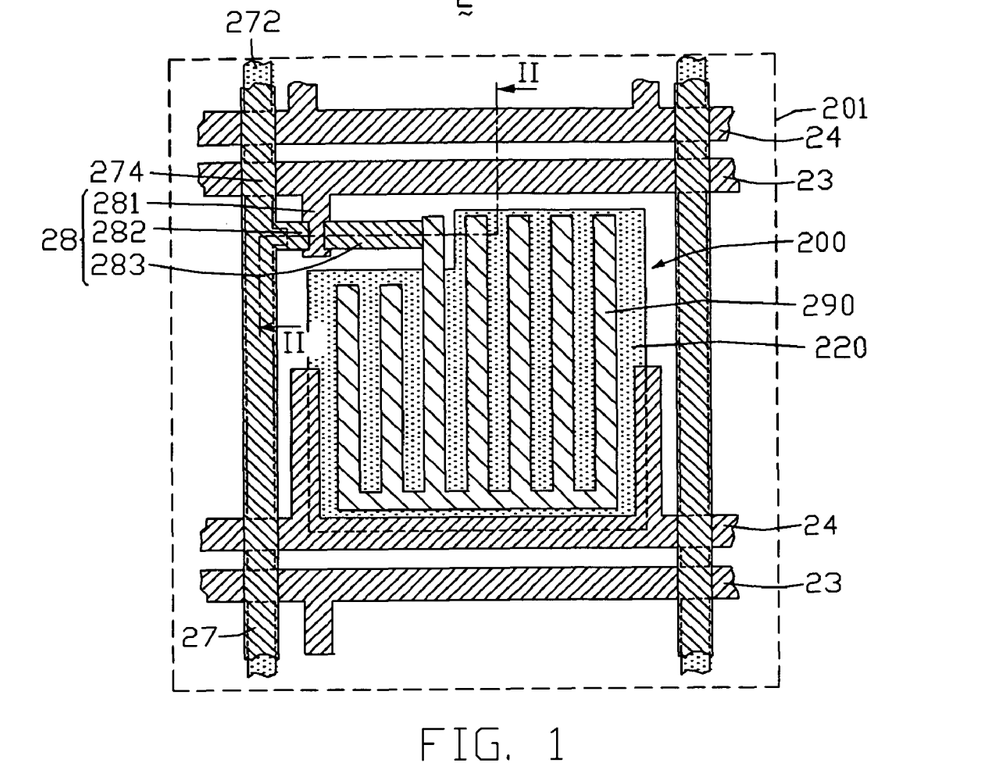
FIG. 1 is an abbreviated, top view of part of a TFT array substrate according to an exemplary embodiment of the present invention.
Figure 2:
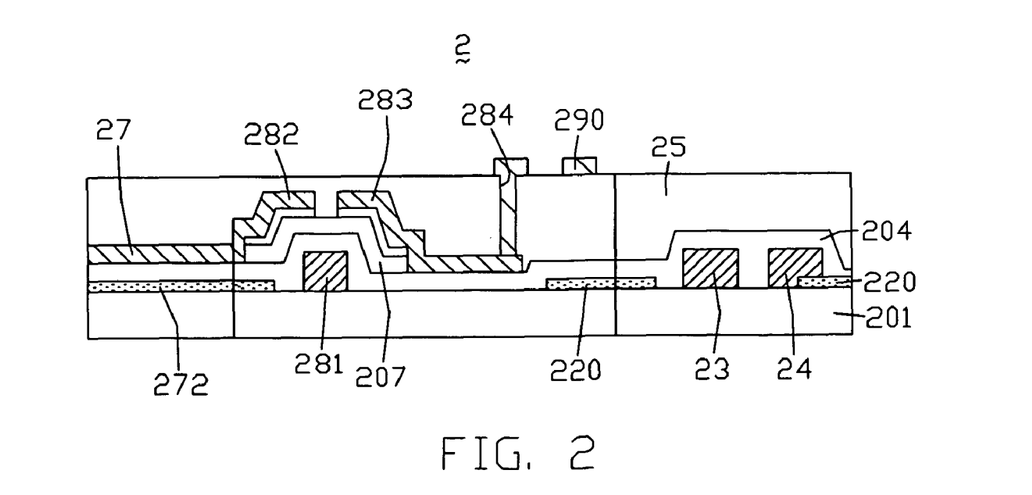
FIG. 2 is an enlarged, cross-sectional view taken along line II-II of FIG. 1.

Referring to FIG. 1 and FIG. 2, FIG. 1 is an abbreviated, top view of part of a TFT array substrate according to an exemplary embodiment of the present invention. FIG. 2 is an enlarged, cross-sectional view taken along line II-II of FIG. 1. The TFT array substrate 2 includes a plurality of gate lines 23, a plurality of common lines 24, a plurality of data lines 27, and a plurality of repair lines 272. The data lines 27 are arranged parallel to each other, and each data line 27 extends along a longitudinal direction. The gate lines 23 are arranged parallel to each other, and each gate line 23 extends along a horizontal direction. Thus, the crossing data lines 27 and gate lines 23 cooperatively define a multiplicity of pixel regions 200. The common lines 24 are parallel to the gate lines 23, and each of the common lines 24 crosses a row of pixel regions 200. Each repair line 272 is disposed corresponding to one of the data lines 27, and is parallel to the corresponding data line 27. The repair line 272 defines a plurality of gaps 274 each corresponding to an overlap with the gate line 23 and the common line 24.

In each pixel region 200, a TFT 28 is provided in the vicinity of a respective point of intersection of the gate lines 23 and the data lines 27. A comb-shaped pixel electrode 290 and a plate-shaped common electrode 220 are laminated in the pixel region. The TFT 28 has a gate electrode 281 electrically connected with the gate line 23, a source electrode 282 electrically connected with the data line 27, and a drain electrode 283 connected to the pixel electrode 290 via a through hole 284. The common line 24 is disposed between the pixel electrode 290 and a neighboring gate line 23, and extends along a direction parallel to the gate line 23. The common line 24 is connected to the common electrode 220 in order to provide common voltage signals thereto.

The TFT array substrate 20 further includes an insulating substrate 201, a gate insulating layer 204, a semiconductor layer 207 and a passivation material layer 25. The gate line 23, the common line 24, the repair line 272, the gate electrode 281, and the common electrode 220 are formed on the substrate 201. The gate insulating layer 204 is formed on the repair line 272, the gate electrode 281, the common electrode 220, the gate line 23, and the common line 24. The semiconductor layer 207 is formed on the gate insulating layer 204 above the gate electrode 281. The source electrode 282 and the drain electrode 283 are formed on two ends of the semiconductor layer 207 symmetrically. The data line 27 is formed on the gate insulating layer 204 correspondingly above the repair line 272, and is electrically connected to the source electrode 282. The passivation material layer 25 is formed on the data line 27, the TFT 28 and the gate insulating layer 204. The through hole 284 is formed in the passivation material layer 25. The pixel electrode 290 is formed on the passivation material layer 25 and is electrically connected to the drain electrode 283 via the through hole 284.

Figure 3:
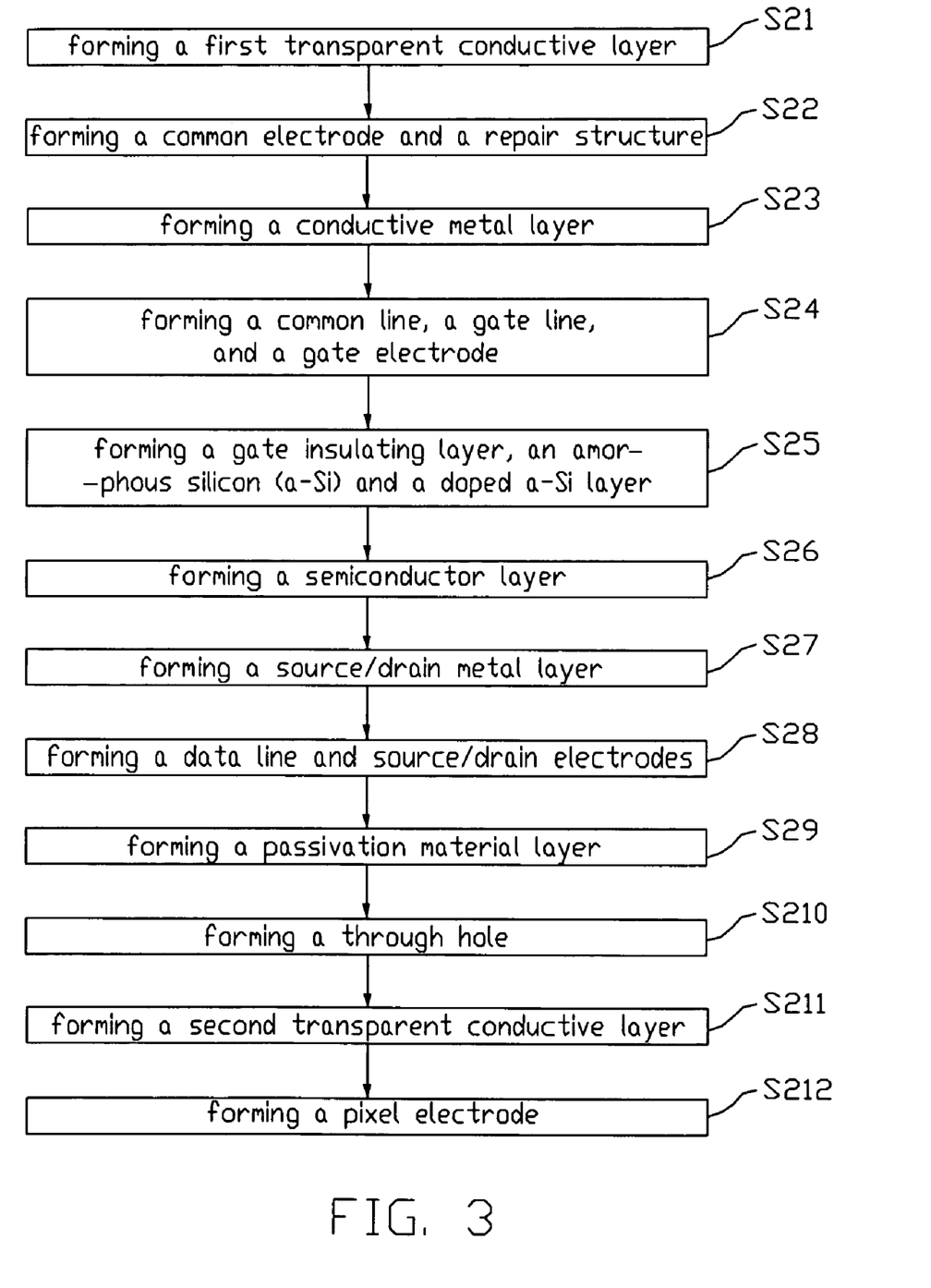
FIG. 3 is a flowchart summarizing an exemplary method for fabricating the TFT array substrate of FIG. 1.

Referring to FIG. 3, this is a flowchart summarizing an exemplary method for fabricating the TFT array substrate 2. For simplicity, the flowchart and the following description are couched in terms that relate to the part of the TFT array substrate 2 shown in FIG. 1. The method includes: step S21, forming a first transparent conductive layer; step S22, forming a common electrode and a repair line; step S23, forming a conductive metal layer; step S24, forming a common line, a gate line, and a gate electrode; step S25, forming a gate insulating layer, an amorphous silicon (a-Si) and a doped a-Si layer; step S26, forming a semiconductor layer; step S27, forming a source/drain metal layer; step S28, forming a data line and source/drain electrodes; step S29, forming a passivation material layer; step S210, forming a through hole; step S211, forming a second transparent conductive layer; and step S212, forming a pixel electrode.

Figure 4:
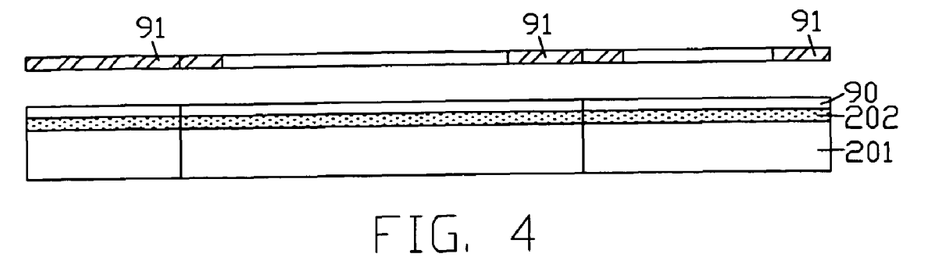
FIGS. 4 to 16 are schematic, side cross-sectional views relating to steps of the method of FIG. 3.

In step S21, referring to FIG. 4, an insulating substrate 201 is provided. The substrate 201 may be made from glass or quartz. A first transparent conductive layer 202 and a first photo-resist layer 90 are sequentially formed on the substrate 201. The transparent conductive layer 202 can be made from indium-tin-oxide (ITO) or indium-zinc-oxide (IZO). A first photo-mask 91 is also provided above the first photo-resist layer 90.

Figure 5:
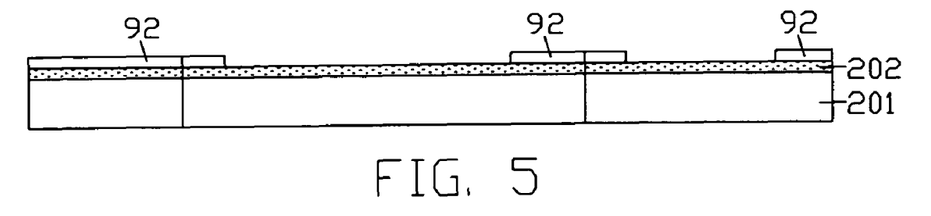
Figure 6:
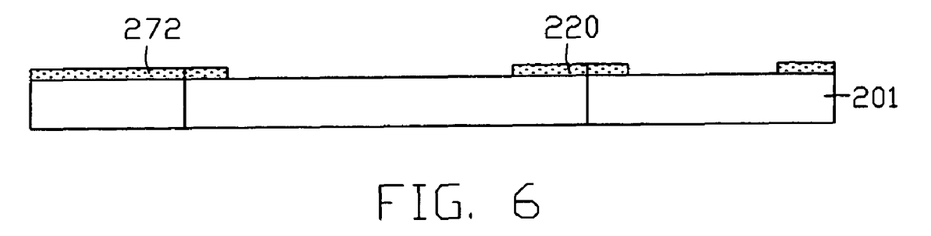

In step S22, referring to FIG. 5 to FIG. 6, the first photo-resist layer 90 is exposed by the first photo-mask 91, and then is developed, thereby forming a first photo-resist pattern 92. The transparent conductive layer 202 is etched by a wet etching method, thereby forming a pattern of the common electrode 220 and a pattern of the repair line 272, which correspond to the first photo-resist pattern 92. In this step, the gaps 274 (as shown in FIG. 1) are also formed. The first photo-resist pattern 92 is then removed by an acetone solution.

Figure 7:
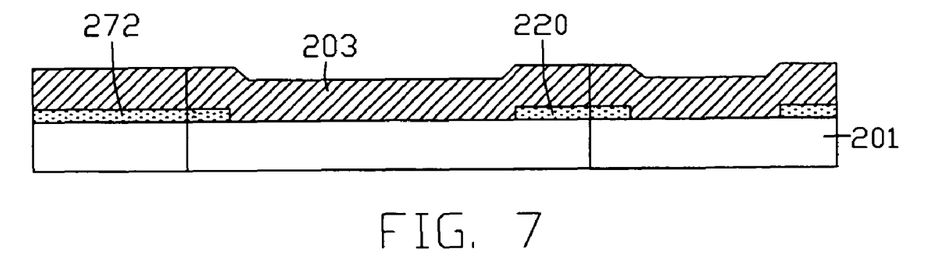

In step S23, referring to FIG. 7, a conductive metal layer 203 and a second photo-resist layer (not shown) are sequentially formed on the substrate 201, the common electrode 220, and the repair line 272. The conductive metal layer 203 may be made from material including any one or more items selected from the group consisting of aluminum (Al), molybdenum (Mo), copper (Cu), chromium (Cr), and tantalum (Ta).

Figure 8:
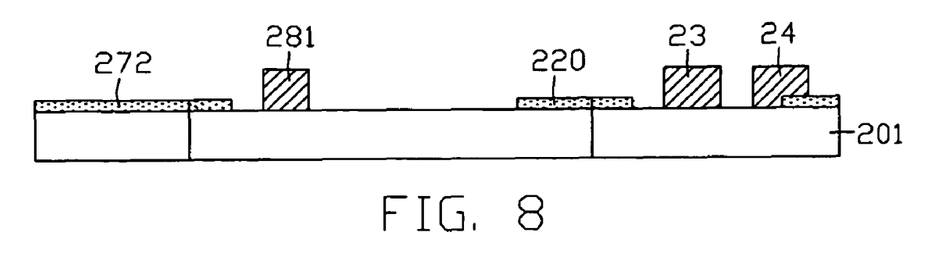

In step S24, referring to FIG. 8, the second photo-resist layer is exposed by a second photo-mask (not shown), and then is developed, thereby forming a second photo-resist pattern (not shown). The conductive metal layer 203 is etched, thereby forming a pattern of the gate electrode 281, the gate line 23, and the common line 24, which correspond to the second photo-resist pattern. The gate electrode 281 and the gate line 23 are incorporated. The second photo-resist pattern is then removed by an acetone solution.

Figure 9:
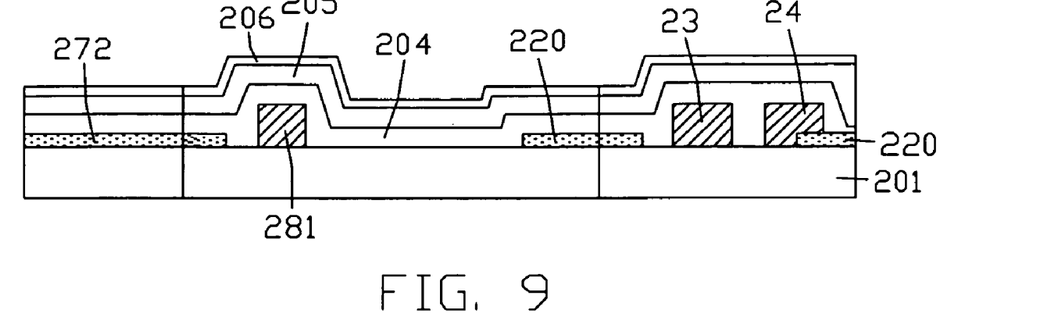

In step S25, referring to FIG. 9, a gate insulating layer 204 is formed on the substrate 201 having the gate electrode 281, the common electrode 220, the gate line 23, and the common line 24 by a chemical vapor deposition (CVD) process. In this process, silane (SiH4) reacts with alkaline air (NH4+) to obtain silicon nitride (SiNx), a material of the gate insulating layer 204. An a-Si layer 205 is deposited on the gate insulating layer 204 by a CVD process. A top layer of the a-Si layer 205 is doped, thereby forming a doped a-Si layer 206. Then a third photo-resist layer (not shown) is formed on the doped a-Si layer 206.

Figure 10:
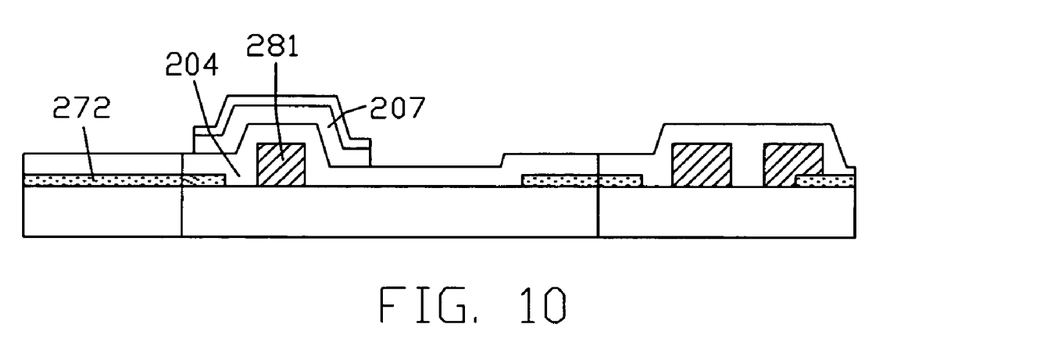

In step S26, referring to FIG. 10, an ultraviolet (UV) light source and a third photo-mask (not shown) are used to expose the third photo-resist layer. Then the exposed third photo-resist layer is developed, thereby forming a third photo-resist pattern. Using the third photo-resist pattern as a mask, portions of the doped a-Si layer 206 and the a-Si layer 205 which are not covered by the third photo-resist pattern are etched away, thereby forming an a-Si pattern (not labeled) and a doped a-Si pattern (not labeled). The a-Si pattern and the doped a-Si pattern cooperatively define the semiconductor layer 207. The third photo-resist pattern is then removed by an acetone solution.

Figure 11:
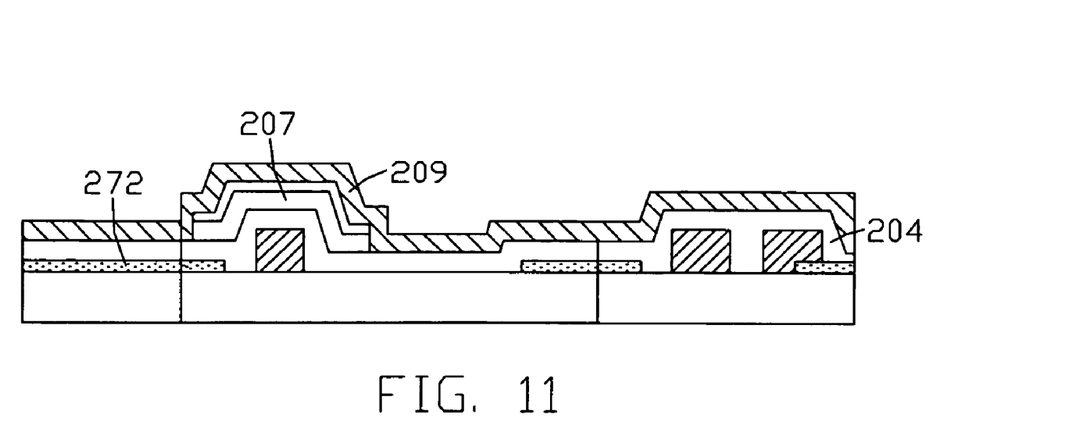

In step S27, referring to FIG. 11, a source/drain metal layer 209 is then deposited on the semiconductor layer 207 and the gate insulating layer 204. The source/drain metal layer 209 may be made from material including any one or more items selected from the group consisting of aluminum, aluminum alloy, molybdenum, tantalum, and molybdenum-tungsten alloy. Then a fourth photo-resist layer (not shown) is formed on the source/drain metal layer 209.

Figure 12:
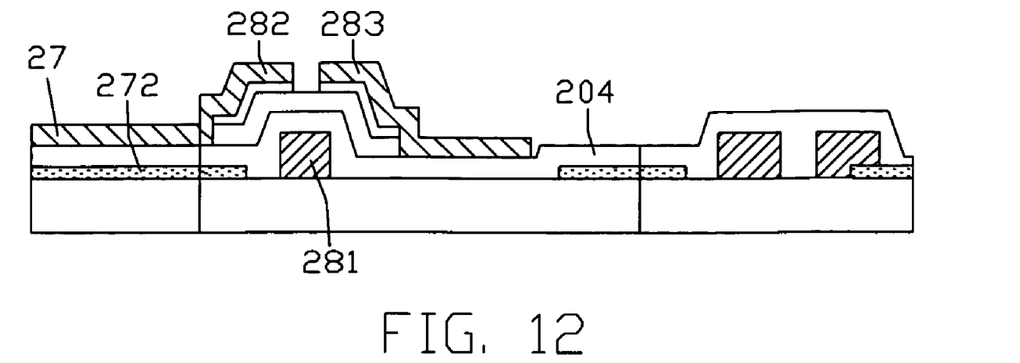

In step S28, referring to FIG. 12, the fourth photo-resist layer is exposed by a fourth photo-mask (not shown), and then is developed, thereby forming a fourth photo-resist pattern. The source/drain metal layer 209 is etched, thereby forming a pattern of the source/drain electrodes 282, 283 and a data line 27. The source/drain electrodes 282, 283 are formed on two ends of the semiconductor layer 207 symmetrically. The data line 27 is formed essentially above the repair line 272 on the gate insulting layer 204. A width of the data line 27 is generally equal to a width of the repair line 272. Using the source/drain electrodes 282, 283 as a mask, portions of the doped a-Si pattern 206 which are not covered by the source/drain electrodes 282, 283 are etched away, thereby departing the doped a-Si pattern 206 into two parts. The fourth photo-resist pattern is then removed.

Figure 13:
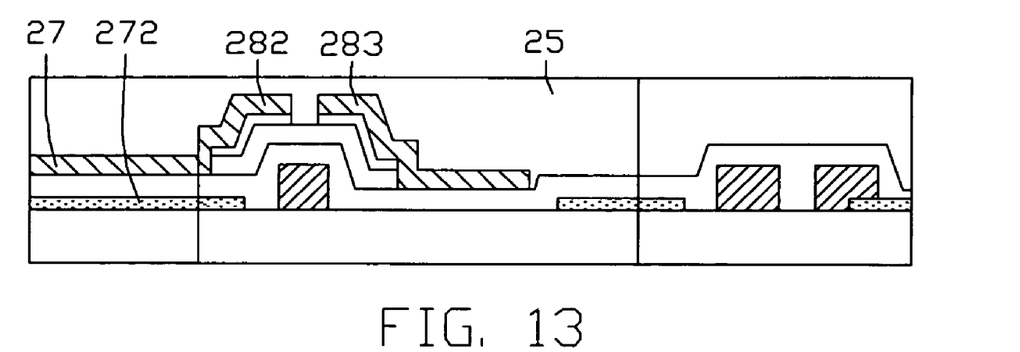

In step S29, referring to FIG. 13, the passivation material layer 25 and a fifth photo-resist layer (not shown) are sequentially formed on the source/drain electrodes 282, 283, the data line 27 and the gate insulating layer 204. The passivation material layer 25 is made from silicon nitride (SiNx) or silicon oxide (SiOx).

Figure 14:
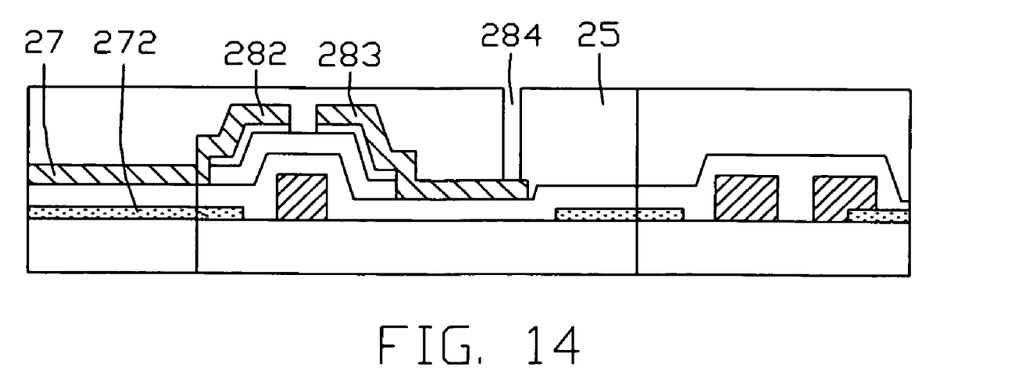

In step S210, referring to FIG. 14, the fifth photo-resist layer is exposed by a fifth photo-mask (not shown), and then is developed, thereby forming a fifth photo-resist pattern. A portion of the passivation material layer 25 is etched, thereby forming the through hole 284 in the passivation material layer 25. The through hole 284 is above the drain electrode 283, in order to expose a portion of the drain electrode 283. The fifth photo-resist pattern is then removed.

Figure 15:
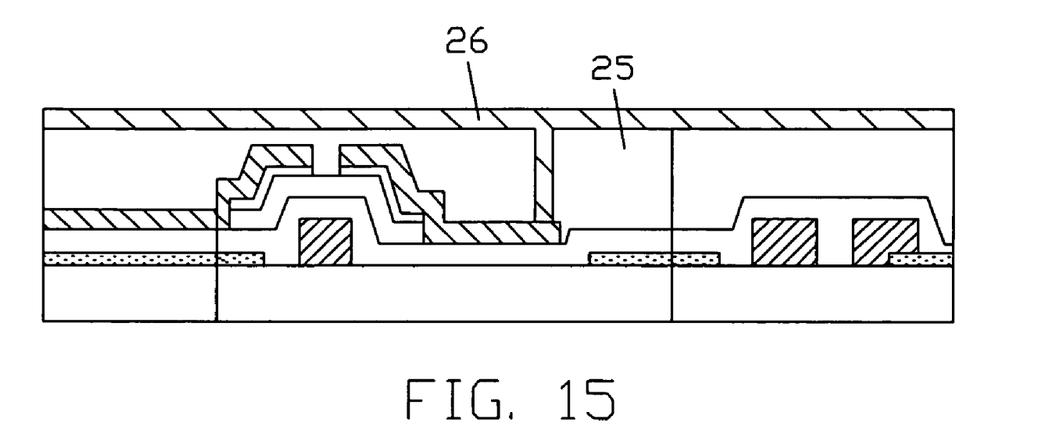

In step S211, referring to FIG. 15, a transparent conductive layer 26 and a sixth photo-resist layer (not shown) are sequentially formed on the passivation material layer 25. The second transparent conductive layer 26 fills the through hole 284.

Figure 16:
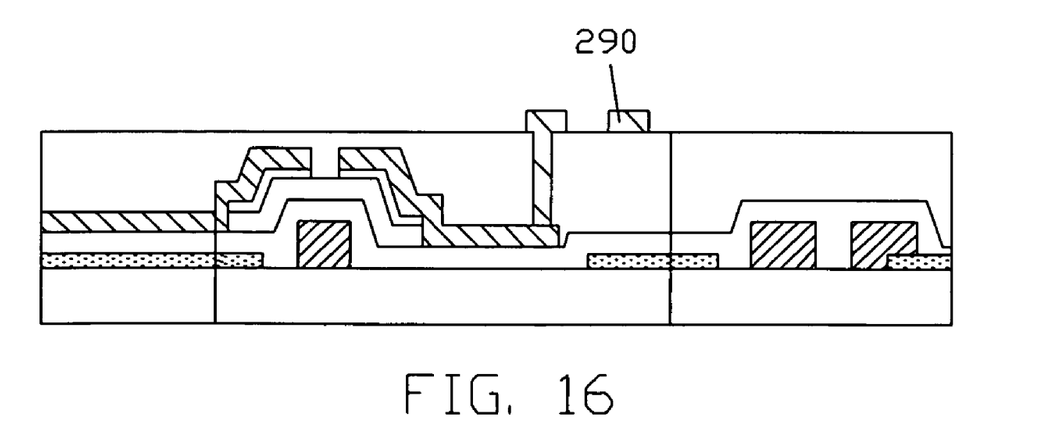

In step S212, referring to FIG. 16, the sixth photo-resist layer is exposed by a sixth photo-mask (not shown), and then is developed, thereby forming a sixth photo-resist pattern. A portion of the second transparent conductive layer 26 is etched, thereby forming a pattern of the pixel electrode 290, which corresponds to the sixth photo-resist pattern. The pixel electrode 290 is electrically connected the drain electrode 283 via the though hole 284. The sixth photo-resist pattern is then removed.

In the above-described exemplary method for fabricating the TFT array substrate 2, the repair line 272 and the common electrode 220 are formed in the same photolithograph process. Therefore, an additional photolithography process is not needed, and a production efficiency of the method for fabricating the TFT array substrate 2 is increased accordingly.

The repair line 272 is positioned between the insulating substrate 201 and the gate insulating layer 204. If the data line 27 has a broken gap, a portion of the gate insulating layer 204 corresponding to the broken gap can be removed by a laser process. Because the repair line 272 is parallel to the gate line 27 and has the gaps 274 located at positions overlapping the gate lines 23 and the common lines 24, the repair line 272 can be electrically connected to the data line 27 at the broken gap by a welding process. The gate line 23 and the common line 24 are not interfered by the repair line 272. In this case, the broken gap of the data line 27 is filled and the data line 27 is repaired. The reliability of the TFT array substrate 2 is increased.

In an alternative embodiment, a width of the repair line 272 can be just one half of a width of the corresponding data line 27. In further alternative embodiment, the repair line 272 can be formed in a same photolithograph process with the gate line 23, the common line 24, and the gate electrode 281.

It is to be understood, however, that even though numerous characteristics and advantages of the present embodiments have been set out in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A method for fabricating a thin film transistor (TFT) array substrate, the method comprising:
   providing an insulating substrate;
   forming a common electrode on the insulating substrate and a repair structure on the insulating substrate by a first photolithograph process, the repair structure having a plurality of gaps;
   forming a common line, a gate line, and a gate electrode on the insulating substrate by a second photolithograph process, the gate electrode being connected to the gate line;
   forming a gate insulating layer and a semiconductor layer on the gate insulating layer by a third photolithograph process, the semiconductor layer being above the gate electrode; and
   forming a data line and source/drain electrodes on the gate insulating layer by a fourth photolithograph process, the data line being above the repair structure and intersecting with the gate line and the common line, wherein the gaps of the repair structure each correspond to an overlap of the gate line and the repair line, or an overlap of the common line and repair line.

2. The method as claimed in claim 1, further comprising forming a passivation material layer by a fifth photolithograph process, the passivation layer being provided between the common electrode and the gate line, and between the gate line and the common line.

3. The method as claimed in claim 1, further comprising forming a pixel electrode on the passivation material layer by a sixth photolithograph process.

4. The method as claimed in claim 1, wherein the common line is parallel to and adjacent to the gate line.

5. The method as claimed in claim 1, wherein the common line is connected to the common electrode in order to provide common voltage signals thereto.

6. The method as claimed in claim 1, wherein the fifth photolithograph process comprises coating a photo-resist layer on the insulating substrate on the passivation material layer, exposing the photo-resist layer using a photo-mask, and developing the exposed photo-resist layer to form a photo-resist pattern.

7. The method as claimed in claim 6, wherein the fifth photolithograph process further comprises etching the passivation material layer which is above the drain electrode, thereby forming a through hole therein.

8. The method as claimed in claim 7, wherein the drain electrode is electrically connected to the pixel electrode by the through hole.

9. The method as claimed in claim 1, wherein the data line is parallel to the repair structure.

10. The method as claimed in claim 1, wherein a width of the repair structure is equal to a width of the data line, or equal to half of a width of the data line.

11. The method as claimed in claim 1, wherein the insulating substrate is made from glass or quartz.

12. The method as claimed in claim 1, wherein the common electrode and pixel electrode are made from indium-tin-oxide or indium-zinc-oxide.

13. The method as claimed in claim 1, wherein the gate electrode, the gate line, and the common line are made from material including any one or more items selected from the group consisting of aluminum, molybdenum, copper, chromium, and tantalum.

14. The method as claimed in claim 1, wherein the source/drain electrodes are made from material including any one or more items selected from the group consisting of aluminum, aluminum alloy, molybdenum, tantalum, and molybdenum-tungsten alloy.

15. A thin film transistor array substrate comprising:
an insulating substrate;
a gate line and a repair structure provided on the insulating substrate, the repair structure having a gap;
a gate insulating layer covering the gate line and the repair structure;
a data line arranged on the gate insulating layer corresponding to the repair structure, which is insulated from the gate line and intersects with the gate line;
wherein the gap of the repair structure is located at where the repair structure overlapping the gate line.

16. The thin film transistor array substrate as claimed in claim 15, further comprising a common line parallel to the data line and a common electrode arranged on the insulating substrate, the common electrode being electrically connected to the common line in order to provide a common voltage signal thereto.

17. The thin film transistor array substrate as claimed in claim 16, wherein the repair structure further comprises a gap located at where the repair structure overlapping to the common line.

18. The thin film transistor array substrate as claimed in claim 17, further comprising a pixel electrode corresponding to the common electrode, the pixel electrode being insulated from the common electrode.

19. The thin film transistor array substrate as claimed in claim 15, wherein a width of the repair structure is equal to a width of the data line.

20. The thin film transistor array substrate as claimed in claim 18, further comprising a thin film transistor arranged at a vicinity of an intersection of the gate line and the data line, the thin film transistor comprising a gate electrode connected to the gate line, a source electrode connected to the data line, and a drain electrode connected to the pixel electrode.

* * * * *

UNITED STATES PATENT AND TRADEMARK OFFICE
CERTIFICATE OF CORRECTION

PATENT NO.         : 7,901,951 B2
APPLICATION NO.    : 12/005715
DATED              : March 8, 2011
INVENTOR(S)        : Hung-Yu Chen et al.

It is certified that error appears in the above-identified patent and that said Letters Patent is hereby corrected as shown below:

On the title page, item [73] should read

-- (73) Assignees: Chimei Innolux Corporation, Miao-Li County (TW). --

Signed and Sealed this
Seventh Day of June, 2011

David J. Kappos
*Director of the United States Patent and Trademark Office*